(12) United States Patent
Fukuzaki

(10) Patent No.: US 10,304,760 B2
(45) Date of Patent: May 28, 2019

(54) LEAD FRAME AND METHOD FOR MANUFACTURING THE SAME

(71) Applicant: OHKUCHI MATERIALS CO., LTD., Kagoshima (JP)

(72) Inventor: Jun Fukuzaki, Kagoshima (JP)

(73) Assignee: OHKUCHI MATERIALS CO., LTD., Kagoshima (JP)

(*) Notice: Subject to any disclaimer, the term of this patent is extended or adjusted under 35 U.S.C. 154(b) by 0 days.

(21) Appl. No.: 15/891,755

(22) Filed: Feb. 8, 2018

(65) Prior Publication Data

US 2018/0226327 A1 Aug. 9, 2018

(30) Foreign Application Priority Data

Feb. 8, 2017 (JP) ................. 2017-021716

(51) Int. Cl.
| | | |
|---|---|---|
| H01L 23/48 | (2006.01) | |
| H01L 23/49 | (2006.01) | |
| H05K 1/05 | (2006.01) | |
| H01L 23/495 | (2006.01) | |
| H01L 21/48 | (2006.01) | |
| H05K 1/02 | (2006.01) | |

(52) U.S. Cl.
CPC .... *H01L 23/49544* (2013.01); *H01L 21/4828* (2013.01); *H01L 21/4842* (2013.01); *H01L 23/49541* (2013.01); *H01L 23/49548* (2013.01); *H05K 1/0296* (2013.01); *H05K 1/05* (2013.01)

(58) Field of Classification Search
CPC .......... H01L 23/49544; H01L 21/4828; H05K 1/0298; H05K 1/053; H05K 1/056; H05K 1/09; H05K 1/18; H05K 1/181; H05K 3/0017; H05K 3/0344; H05K 3/0052
See application file for complete search history.

(56) References Cited

U.S. PATENT DOCUMENTS

| | | | | |
|---|---|---|---|---|
| 7,968,377 B2 * | 6/2011 | Chow | ................... | H01L 21/561 257/678 |
| 9,349,612 B2 * | 5/2016 | Ishibashi | ........... | H01L 23/49541 |
| 2017/0117210 A1 * | 4/2017 | Hayashi | .............. | H01L 23/3157 |

FOREIGN PATENT DOCUMENTS

JP 2008-182175 8/2008

* cited by examiner

*Primary Examiner* — Ishwarbhai B Patel
(74) *Attorney, Agent, or Firm* — Wenderoth, Lind & Ponack, L.L.P.

(57) ABSTRACT

A lead frame constitutes a product unit in a multi-row lead frame and has a dam bar and a lead connected together. The dam bar has a first site where connection is made with the lead and a second site adjoining the first site without connection with the lead. A predetermined range in the lead near a connecting portion with the dam bar and the second site in the dam bar have a plate thickness smaller than that of the first site having a same plate thickness as a metal plate as a material from which the dam bar and the lead are made.

1 Claim, 5 Drawing Sheets

☒ HALF-ETCHED PORTION  ☒ FULL-METAL PORTION

▨ HALF-ETCHED PORTION

LEAD FRAME AND METHOD FOR MANUFACTURING THE SAME

CROSS-REFERENCE TO RELATED PATENT APPLICATIONS

This application claims the benefit of Japanese Patent Application No. 2017-21716 filed in Japan on Feb. 8, 2017, the contents of which are incorporated herein by reference.

BACKGROUND OF THE INVENTION

1) Field of the Invention

The present invention relates to a lead frame that constitutes a product unit in a multi-row lead frame formed by etching and that has, at least, a dam bar with a plate thickness, at a predetermined position thereof, smaller than a plate thickness of a metal plate forming a base material of the lead frame, and a lead connected with the dam bar and having a plate thickness, in a predetermined range from an end portion thereof at which connection is made with the dam bar, smaller than the plate thickness of the metal plate, and a method for manufacturing the same.

2) Description of Related Art

In a lead frame constituting a product unit in a multi-row lead frame, each of a site called "pad" and a site called "island", on which typically a chip is to be mounted or which is to serve as an individual terminal, has a lead via which connection is made with the entire frame as a supporting member. While leads of these sites are coupled with support leads to be integral therewith, they may be a cause of deformation for insufficient strength dependent on the shape. QFN (Quad Flat Non-Leaded Package)-type and LED-type lead frames are structured such that leads and support leads of these sites are subjected to half-etching on at least one of the front side and the back side, often to have a long and thin shape for example with a length of 2 mm or more and a thickness of 0.5 mm or less, and thus are particularly liable to be deformed.

In a lead formed by half-etching, since about 50 to 70% of the plate thickness of the metal plate used as the material of the lead frame is dissolved by etching, the internal stress is released to generate strain. This strain undulates and deforms the entire frame. The wider the half-etched area is and the deeper the half-etched portion is, the larger the degree of deformation comes to be. Further, in a case where leads formed by half-etching are long and thin or are cranked, since the tip ends, which are the portions for example to become terminals, of the leads are liable to have a level difference, torsional deformation would be frequently caused by an excessive load given to the thinnest support leads, as an object of cutting, coupled with the leads, due to the tip ends of the leads being caught or so during conveyance in the manufacturing procedure for the lead frame.

On the other hand, of support leads, the dam bar, which is a support lead as an object of cutting, is partially or in its entirety be removed by sawing process. Thus, if these sites are formed without undergoing half-etching, in cutting process for separating the entirety into individual product units after mounting semiconductor elements on the lead frame and resin-sealing them, a large volume of the metal parts is liable to cause a cutting blade, which should cut the resin and the metal simultaneously, to clog, and thus continuous processing time cannot be taken long.

Therefore, conventionally, lead frames with a goal set to secure the strength and the dicing processability of dam bars, which are support leads as an object of cutting, have been proposed for example in Japanese Patent Application Laid-Open (KOKAI) No. 2008-182175.

In a lead frame according to JP KOKAI No. 2008-182175, as shown in FIGS. 3A-3C for example, in each first site 53 composed of a connecting portion 51, in a dam bar 50, connected with respective terminal portions 60 and sites to be removed via dicing in the terminal portions 60 connected with the connecting portion 51, sites rather close to end portions in the width direction of the first site 53 undergo thinning treatment by half-etching, and a center portion in the width direction of the first site 53 comes to be a thick portion, whereas, in each second site 52 located between the connecting portions 51 in the dam bar 50, both end portions in the width direction of the second site 52 undergo thinning treatment by half-etching, and a center portion in the width direction of the second site 52 comes to be a thick portion having the same width as the center portion in the width direction of the first site 53, wherein the thinning treatment is performed from one surface side such that an end-to-end distance W1 over the sites undergoing the thinning treatment in the first site 53 is made larger than the width W2 of the second site 52 and is equal to or smaller than the width W3 of the first site 53.

In a lead frame of another example described in JP KOKAI No. 2008-182175, as shown in FIGS. 4A-4C for example, in both of the first site 53 and the second site 52, the central site in the width direction is formed as a half-etched portion, and the peripheries closer to the end portions in the width direction come to be portions thicker than the half-etched portion without being half-etched.

Further, in a lead frame of still another example described in JP KOKAI No. 2008-182175, as shown in FIGS. 5A-5C for example, only the first site 53 is thinned by half-etching, and the second site 52 is not half-etched at all, to be, in its entirety, a portion thicker than the half-etched portion.

In this way, the lead frames according to JP KOKAI No. 2008-182175 are intended to facilitate cutting process by partially thinning dam bars, and to secure the strength of a multi-row lead frame by forming thinned, easily cuttable sites and sites thicker than the easily cuttable sites for securing the strength.

SUMMARY OF THE INVENTION

A lead frame according to some embodiment of the present invention constitutes a product unit in a multi-row lead frame and has, at least, a dam bar with a plate thickness, at a predetermined position thereof, smaller than a plate thickness of a metal plate forming a base material of the lead frame, and a lead connected with the dam bar and having a plate thickness, in a predetermined range from an end portion thereof at which connection is made with the dam bar, smaller than the plate thickness of the metal plate, wherein a first site, which is defined as surrounded by sides of the dam bar along a width direction of the lead at the end portion thereof at which connection is made with the dam bar and sides of the dam bar along a width direction thereof, has a same plate thickness as the plate thickness of the metal plate, and a second site, which adjoins the first site in the dam bar and is not connected with the lead, has a plate thickness smaller than the plate thickness of the metal plate.

A method according to some embodiment of the present invention for manufacturing a lead frame having, at least, a dam bar with a plate thickness, at a predetermined position thereof, smaller than a plate thickness of a metal plate forming a base material of the lead frame, and a lead connected with the dam bar and having a plate thickness, in a predetermined range from an end portion thereof at which connection is made with the dam bar, smaller than the plate thickness of the metal plate, includes subjecting the metal plate to half-etching treatment with a predetermined pattern from at least one side of the metal plate, to thereby form a first site, which is defined as surrounded by sides of the dam bar along a width direction of the lead at the end portion thereof at which connection is made with the dam bar and sides of the dam bar along a width direction thereof, having the same plate thickness as the plate thickness of the metal plate, and a second site, which adjoins the first site in the dam bar and is not connected with the lead, having a plate thickness smaller than the plate thickness of the metal plate.

These and other features of the present invention will become apparent from the following detailed description of the preferred embodiments when taken in conjunction with the accompanying drawings.

BRIEF DESCRIPTION OF THE DRAWINGS

FIG. 1A is a plan view, FIG. 1B is a perspective view, and FIG. 1C is a side view.

FIG. 2A is a plan view, FIG. 2B is a perspective view, and FIG. 2C is a side view.

FIG. 3A is an explanatory diagram that shows a site to be half-etched, FIG. 3B is a cross-sectional view taken along A-A of FIG. 3A, and FIG. 3C is a cross-sectional view taken along B-B of FIG. 3A.

FIG. 4A is an explanatory diagram that shows a site to be half-etched, FIG. 4B is a cross-sectional view taken along C-C of FIG. 4A, and FIG. 4C is a cross-sectional view taken along D-D of FIG. 4A.

FIG. 5A is an explanatory diagram that shows a site to be half-etched, FIG. 5B is a cross-sectional view taken along E-E of FIG. 5A, and FIG. 5C is a cross-sectional view taken along F-F of FIG. 5A.

DETAILED DESCRIPTION OF THE PREFERRED EMBODIMENTS

Figure 1A:
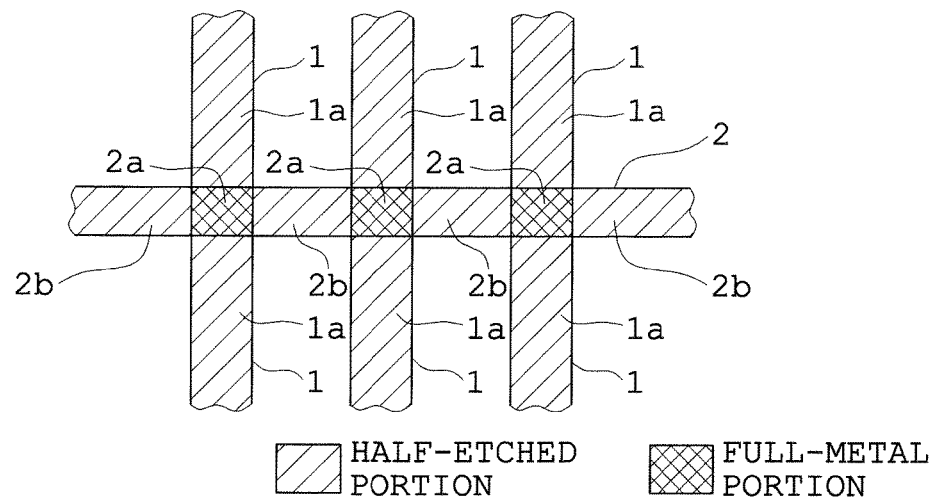
FIGS. 1A-1C are explanatory diagrams for schematically showing the configuration of a main part of a lead frame according to one embodiment of the present invention, where

A lead frame of some embodiments of the present invention constitutes a product unit in a multi-row lead frame and has, at least, a dam bar with a plate thickness, at a predetermined position thereof, smaller than a plate thickness of a metal plate forming a base material of the lead frame, and a lead connected with the dam bar and having a plate thickness, in a predetermined range from an end portion thereof at which connection is made with the dam bar, smaller than the plate thickness of the metal plate, characterized in that a first site, which is defined as surrounded by sides of the dam bar along a width direction of the lead at the end portion thereof at which the connection is made with the dam bar and sides of the dam bar along a width direction thereof, has a same plate thickness as the plate thickness of the metal plate, and a second site, which adjoins the first site in the dam bar and is not connected with the lead, has a plate thickness smaller than the plate thickness of the metal plate.

Subjecting the leads and support leads to half-etching is made for the purpose of preventing solder from oozing into the lead portion, which is the remainder, other than portions to serve as pads to be connected with semiconductor elements or as connecting terminals, reducing influence of noise on the semiconductor elements, and improving fillability of resin into gaps around portions to be connected with the semiconductor elements in performing flip-chip mounting of the semiconductor elements to the lead frame, and of facilitating cutting process by reducing a volume of the metal at the time of cutting the resin and the metal simultaneously after mounting the semiconductor elements and resin-sealing the entirety.

However, if half-etching is performed from one side of a metal plate as a material, strain generated during rolling involved in the metal plate is concentrated on one side. As a result, owing to degradation of the strength caused by half-etching and to the strain remaining on one side, warp and deformation are liable to be large.

In this context, the present applicant has reached, through trial and error, the following idea; configuring a first site, which is defined as surrounded by sides of a dam bar, as a support lead to be cut, along a width direction of a lead at the end portion thereof at which the connection is made with the dam bar and sides of the dambar along a width direction thereof, to have a same plate thickness as the plate thickness of a metal plate forming a base material of the lead frame, and a second site, which adjoins the first site in the dam bar and is not connected with the lead, and the end portion, which at least is connected with the dam bar, of the lead to have a plate thickness smaller than the plate thickness of the metal plate forming the base material of the lead frame makes strain hard to be generated upon making internal stresses cancel out each other.

In the configuration in which, as in the lead frame of some embodiments of the present invention, a first site, which is defined as surrounded by sides of a dam bar to be cut, along a width direction of a lead at the end portion thereof at which the connection is made with the dam bar and sides of the dam bar along a width direction thereof, has a same plate thickness as the plate thickness of a metal plate, and a second site, which adjoins the first site in the dam bar and is not connected with the lead has a plate thickness smaller than the plate thickness of the metal plate, even if leads are long and thin or are cranked, the first site of the dam bar having the same plate thickness as the plate thickness of the metal plate forming the base material of the lead frame can prevent tip ends of the leads from having a level difference and thus from being caught or so during conveyance in the manufacturing procedure for the lead frame, to preclude torsional deformation caused by an excessive load given to the thinnest support lead, as an object of cutting, coupled with the leads.

Also, in the configuration in which, as in the lead frame of some embodiments of the present invention, a second site adjoining the first site in the dam bar and not connected with the lead has a plate thickness smaller than the plate thickness of the metal plate, the cutting process can be facilitated by the reduced volume of the metal in the spot where cutting is made.

Also, in the configuration in which, as in the lead frame of some embodiments of the present invention, a first site, which is defined as surrounded by sides of a dam bar along a width direction of a lead at the end portion thereof at which the connection is made with the dam bar and sides of the dam bar along a width direction thereof, has a same plate thickness as the plate thickness of a metal plate, and a second site adjoining the first site in the dam bar and not connected with the lead has a plate thickness smaller than the plate thickness of the metal plate, depth, width, pitch, number etc. of portions to be half-etched can be freely designed in accordance with the lead; a high degree of freedom in design can be achieved.

Consequently, according to some embodiments of the present invention, by freely designing depth, width, pitch, number etc. of portions to be half-etched in forming an uneven shape in accordance with the leads, it is possible to obtain a lead frame that facilitates cutting process by efficiently reducing the volume of a metal to be cut and is capable of sufficiently preventing deformation, warp and torsion of long and thin or cranked leads and dam bars.

Also, in the configuration in which, as in the lead frame of some embodiments of the present invention, a first site, which is defined as surrounded by sides of a dam bar along a width direction of a lead at the end portion thereof at which connection is made with the dam bar and sides of the dam bar along a width direction thereof, has a same plate thickness as the plate thickness of a metal plate, and a second site adjoining the first site in the dam bar and not connected with the lead has a plate thickness smaller than the plate thickness of the metal plate, in filling with a molding resin, the second site in the dam bar and the lead having a plate thickness smaller than the plate thickness of the metal plate in a predetermined range from the end portion thereof at which connection is made with the dam bar allow the resin to easily flow in around the first site in the dam bar. Therefore, according to the lead frame of the present invention, even though the first site in the dam bar has the same plate thickness as the plate thickness of the metal plate, flow of the resin is not dammed by the dam bar, and thus filling the entire space among adjacent semiconductor-element mounting portions, leads, and dam bars with a resin without leaving unfilled spots, for the primary purpose of which the dam bar is subjected to half-etching, can be surely accomplished.

Hereinafter, an embodiment of the present invention will be described in reference to the drawings.

First Embodiment

Figure 1B:
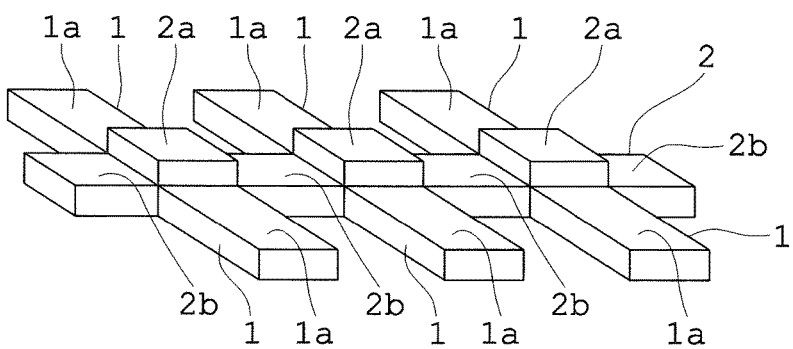
Figure 1C:
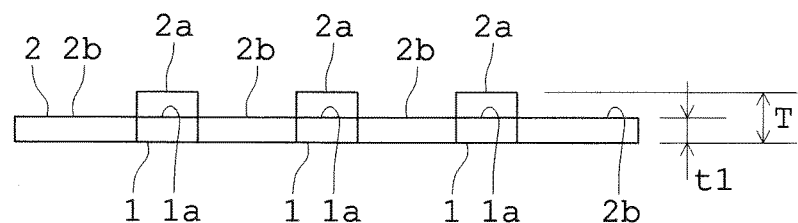
Figure 2A:
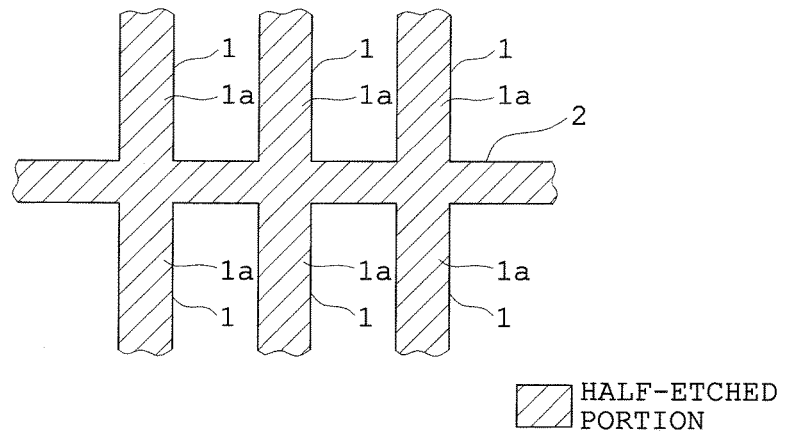
FIGS. 2A-2C are explanatory diagrams for schematically showing the configuration of a main part of a conventional lead frame according to a comparative example, where
Figure 2B:
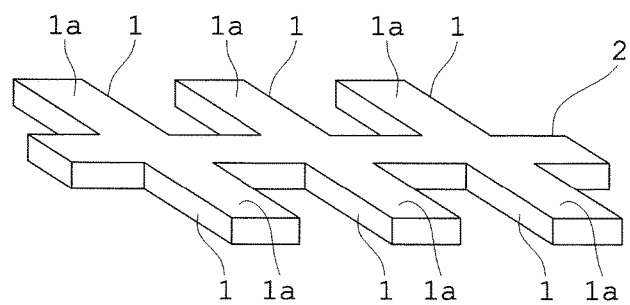
Figure 2C:
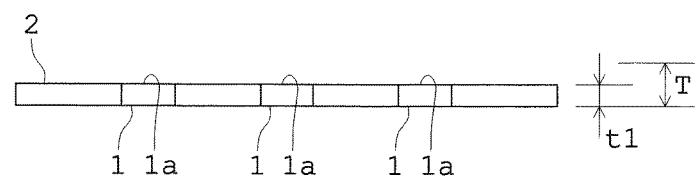
Figure 3A:
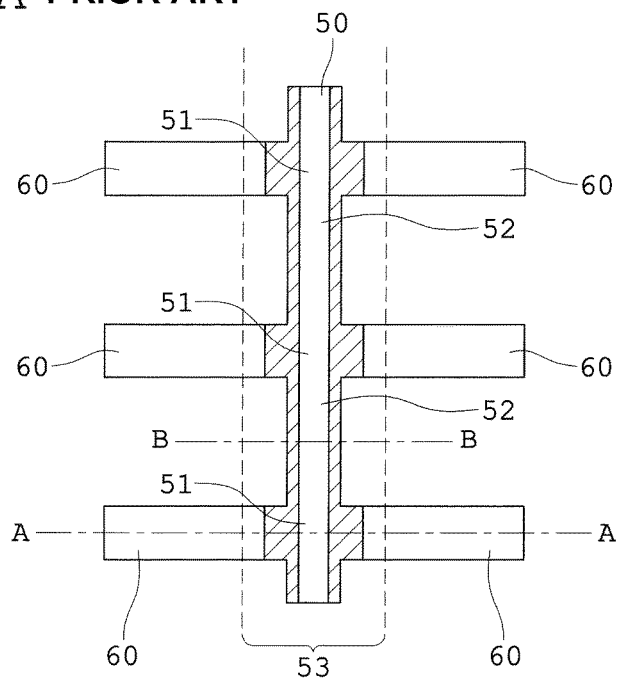
FIGS. 3A-3C They are diagrams for showing the configuration of a dam bar in one example of conventional lead frames, where
Figure 3B:
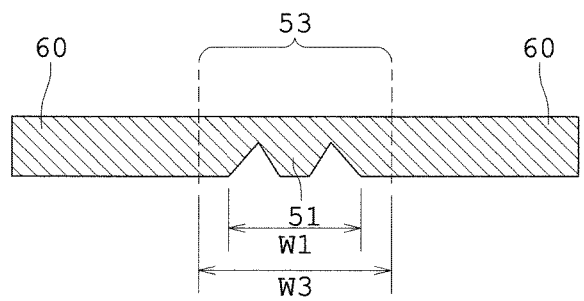
Figure 3C:
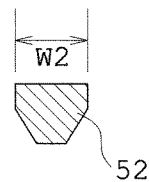
Figure 4A:
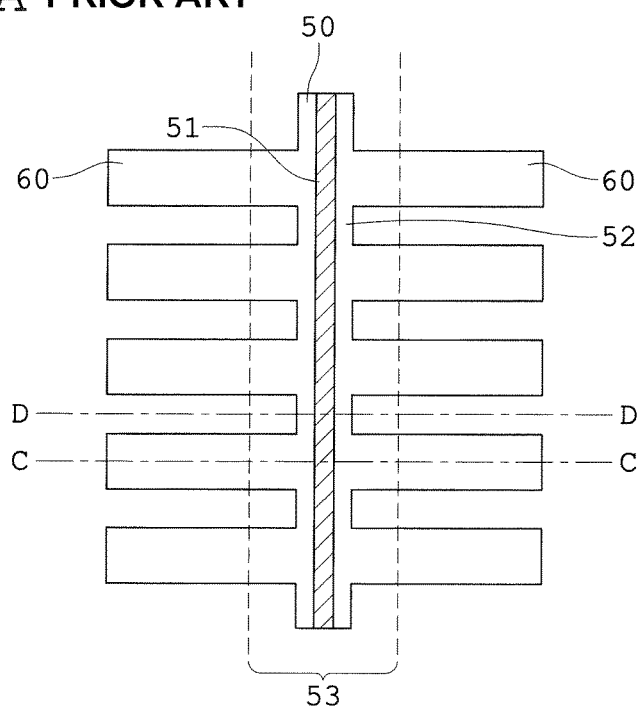
FIGS. 4A-4C are diagrams for showing the configuration of a dam bar in another example of conventional lead frames, where
Figure 4B:
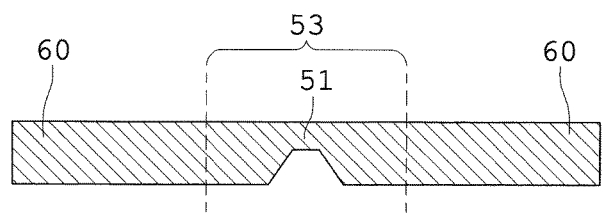
Figure 4C:
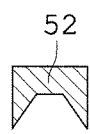
Figure 5A:
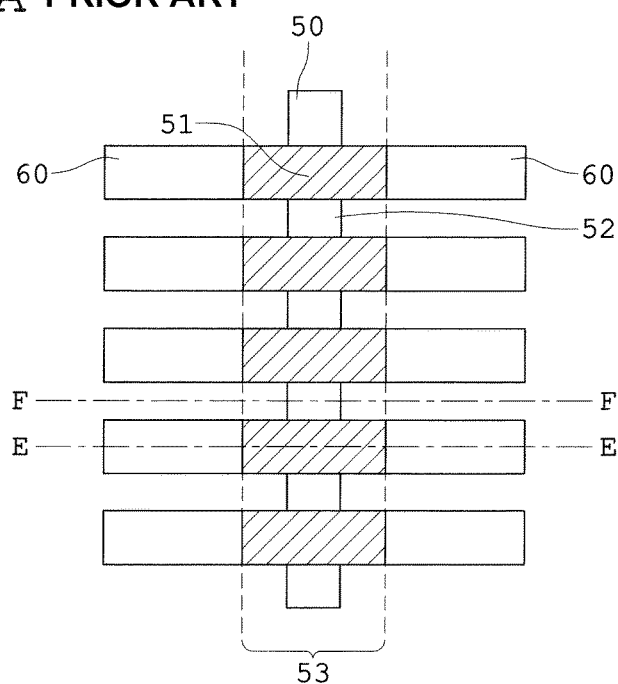
FIGS. 5A-5C are diagrams for showing the configuration of a dam bar in still another example of conventional lead frames, where
Figure 5B:
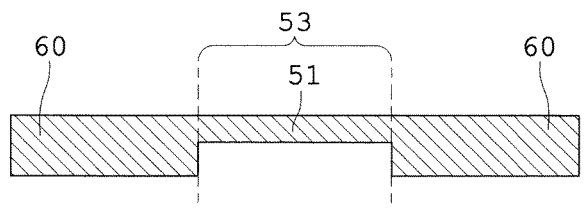
Figure 5C:
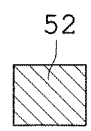

FIGS. 1A-1C are explanatory diagrams for schematically showing the configuration of a main part of a lead frame according to one embodiment of the present invention, where FIG. 1A is a plan view, FIG. 1B is a perspective view, and FIG. 1C is a side view. FIGS. 2A-2C are explanatory diagrams for schematically showing the configuration of a main part of a conventional lead frame according to a comparative example, where FIG. 2A is a plan view, FIG. 2B is a perspective view, and FIG. 2C is a side view.

The lead frame of this embodiment constitutes a product unit in a multi-row lead frame, and at least has a dam bar 2 and leads 1 connected with the dam bar, as shown in FIGS. 1A-1C. For convenience's sake, the tip end portions of the leads are not shown.

Each lead 1 has, in a predetermined range 1a from an end portion thereof connected with the dam bar, a plate thickness t1 smaller than the plate thickness T of the metal plate forming the base material of the lead frame.

In the dam bar 2, a first site 2a, which is defined as surrounded by sides along a width direction of the lead 1 at the end portion thereof at which connection is made with the dam bar 2 and sides along a width direction of the dam bar, has a same plate thickness as the plate thickness T of the metal plate, and a second site 2b adjoining the first site 2a and not connected with the lead 1 has the plate thickness t1 smaller than the plate thickness T of the metal plate.

The plate thickness t1 in the predetermined range 1a in the lead 1 from the end portion thereof at which connection is made with the dam bar 2, or the plate thickness t1 of the second portion 2b in the dam bar 2 is greater than 40% and smaller than 100% of the plate thickness T of the metal plate as a material of the lead frame.

Comparative Tests on Amount of Deformation by Strain Generated in Lead Frames of Embodiment Example and Comparative Example There were manufactured a multi-row lead frame in which a plurality of product-unit lead frames of Embodiment Example 1 provided with the configuration of this embodiment were connected together in a matrix (e.g., 20 to 30 units along each of the row and column directions, in this particular case, 25 units) and, as Comparative Example 1, a multi-row lead frame in which a plurality of product-unit lead frames each having a plate thickness t1, in a predetermined range 1a in a lead 1 from the end portion thereof at which connection was made with a dam bar 2 and in all sites in the dam bar 2, smaller than a plate thickness T of a metal plate as shown in FIGS. 2A-2C were connected together in a matrix (e.g., 20 to 30 units along each of the row and column directions, in this particular case, 25 units), and comparison was made between amounts of deformation caused by respective strains in the multi-row lead frames of Embodiment Example 1 and Comparative Example 1.

The lead frame of Comparative Example 1 was prepared by performing half-etching on the entire surface on one side of the metal plate as a material. To be specific, for the dam bars 2 each with a full-length of 13.0 mm and a width of 0.200 mm, the entire surface on one side of the metal plate as a material was subjected to half-etching to a depth of 0.110 mm. For the leads 1 connected with the dam bars 2 also, regions including cranked portions except tip ends, which were to become terminals, of the leads 1 were subjected to half-etching from one side of the metal plate to a depth of 0.110 mm. Regarding the metal plate as a material, a copper plate with a thickness of 0.200 mm was used.

The lead frame of Embodiment Example 1 was prepared by performing half-etching on predetermined sites on a surface on one side of the metal plate as a material. To be specific, for the dam bars 2 each with a full-length of 13.0 mm and a width of 0.200 mm, half-etching was performed from one side of the metal plate to a depth of 0.110 mm such that the first sites 2a each defined as surrounded by sides along a width direction of the lead 1 at the end portion thereof at which connection was made with the dam bar 2 and sides in the dam bar along a width direction thereof have the same plate thickness as the plate thickness T of the metal plate and such that the second sites 2b each adjoining the first sites 2a and not connected with the leads 1 have a plate thickness t1 smaller than the plate thickness T of the metal plate. For the leads 1 connected with the dam bars 2 also, regions including cranked portions except tip ends, which were to become terminals (the predetermined range 1a from the end portion at which connection was made with the dam bar 2), of the leads 1 were subjected to half-etching from one side of the metal plate to a depth of 0.110 mm. Regarding the metal plate as a material, a copper plate with a thickness of 0.200 mm was used.

Then, comparison was made between amounts of deformation caused by strains in the multi-row lead frames of Embodiment Example 1 and Comparative Example 1 thus having undergone etching treatment, respectively.

Checking of the amount of deformation by strain was conducted by irradiating each multi-row lead frame having undergone etching treatment with light from above and visually observing, at an angle, the manner of reflection of the light, as well as by measuring height of pads from a reference surface. In the visual observation, a multi-row lead frame having a large amount of deformation by strain was recognized to show deformation in the shape of illumination light reflected from the surface of the multi-row lead frame.

Further, each 1000 sheets of the multi-row lead frames of Embodiment Example 1 and Comparative Example 1 were manufactured and examined regarding whether deformation defect occurred, and comparison was made between the lead frames of Comparative Example 1 and Embodiment Example 1 regarding the number of sheets involving deformation defect and the defect rate.

As a result, regarding the lead frames of Comparative Example, deformation defect occurred in all the 100 sheets and thus the defect rate was 100%. In contrast, regarding the lead frames of Embodiment Example 1, the number of sheets involving deformation defect is 2 out of 1000 sheets and thus the defect rate was 0.2%; inhibitory effect against deformation was confirmed.

Manufacturing of the lead frame of Embodiment Example 1 was carried out as follows.

A copper material with a thickness of 0.200 mm was used as the metal plate, and a dry film resist was applied to both sides thereof, to form resist layers.

Then, a glass mask carrying a shape of the lead frame was prepared. In this process, the pattern of the glass mask was designed to form a resist mask through which, for a support lead (dam bar) as an object of cutting, the first site should be left without being half-etched and the second site should be half-etched on one side of the metal plate, and, for a lead connected with the dam bar and long and thin or having a cranked tip end, a predetermined range from the end portion thereof connected with the dam bar should be half-etched.

The pattern of the glass mask was designed such that the depth of the half-etching from one side should be commonly 0.110 mm.

In Embodiment Example 1, the configuration was made to provide a portion that has a cross-section along the longitudinal direction of the dam bar having a continuous unevenness of wave shape composed of the first sites and the second sites among leads that are object of cutting.

The lead frame formed by half-etching upon use of the glass mask thus formed had, on one side, half-etched faces at second sites, which adjoined the first sites and were not connected with a lead, along the longitudinal direction of the dambar, and in a predetermined range from the end portion where connection was made with the dam bar in the lead, and, if a cross section taken along the longitudinal direction of the dam bar were observed, a continuous unevenness of wave shape composed of the first sites and the second sites would be formed. As described above, the remaining plate thickness at the second site after half-etching was 0.090 mm.

What is claimed is:

1. A lead frame constituting a product unit in a multi-row lead frame and having, at least,
   a dam bar with a plate thickness, at predetermined portions thereof, smaller than a plate thickness of a metal plate forming a base material of the lead frame, and
   a plurality of leads connected with and aligned along a longitudinal side of the dam bar, each of the plurality of leads having a plate thickness, in a predetermined range from an end portion thereof at which connection is made with the dam bar, smaller than the plate thickness of the metal plate,
   wherein each of the plurality of leads is arranged opposite to another lead that is included in an adjacent lead frame as a product unit sharing the dam bar, the other lead being connected with an opposite longitudinal side of the dam bar, the lead and the other lead having a same width in a vicinity of the dam bar,
   wherein the dam bar is configured of a first site having a same plate thickness as the plate thickness of the metal plate and a second site having a plate thickness smaller than the plate thickness of the metal plate alternately arranged repeatedly along a longitudinal direction of the dam bar,
   wherein a top view of each first site is a rectangle defined by a first side and a second side across a width of the dam bar, the first side being a segment of the longitudinal side of the dam bar where the dam bar meets one of the plurality of leads and having the width of the lead, and the second side being a segment of the opposite longitudinal side of the dam bar where the dam bar meets the other lead arranged opposite to the lead and included in the adjacent lead frame and having the width of the other lead, and
   wherein a top view of each second site is a rectangle defined by a third side and a fourth side across the width of the dam bar, the third side being a segment of the longitudinal side of the dam bar free from connection with any lead and the fourth side being a segment of the opposite longitudinal side of the dam bar free from connection with any lead included in the adjacent lead frame.

* * * * *